United States Patent
Amanai et al.

[11] Patent Number: 6,115,288
[45] Date of Patent: Sep. 5, 2000

[54] SEMICONDUCTOR MEMORY DEVICE

[75] Inventors: Masakazu Amanai; Hiroyuki Kobatake; Satoru Oku; Kazuaki Kato; Masaki Kaneko, all of Tokyo, Japan

[73] Assignee: NEC Corporation, Tokyo, Japan

[21] Appl. No.: 09/272,311

[22] Filed: Mar. 19, 1999

[30] Foreign Application Priority Data

Mar. 19, 1998 [JP] Japan .................................. 10-069959

[51] Int. Cl.⁷ .............................. G11C 16/06; G11C 5/06
[52] U.S. Cl. .................... 365/185.17; 365/63; 365/51; 365/72; 365/185.11; 365/185.13
[58] Field of Search ........................ 365/185.01, 185.17, 365/51, 63, 72, 185.11, 185.13

[56] References Cited

U.S. PATENT DOCUMENTS

| | | | |
|---|---|---|---|
| 5,748,538 | 5/1998 | Lee et al. | 365/185.06 |
| 5,780,890 | 7/1998 | Hazama | 257/316 |
| 5,822,248 | 10/1998 | Satori et al. | 365/185.21 |
| 5,886,937 | 3/1999 | Jang | 365/203 |
| 5,917,745 | 6/1999 | Fujii | 365/63 |
| 5,923,606 | 7/1999 | Lee et al. | 365/230.03 |
| 5,926,432 | 7/1999 | Kawai et al. | 365/230.03 |
| 5,930,195 | 7/1999 | Komatsu | 365/230.03 |
| 5,973,961 | 10/1999 | Park et al. | 365/185.13 |
| 5,973,983 | 10/1999 | Hidaka | 365/230.03 |

FOREIGN PATENT DOCUMENTS 8-204158  8/1996  Japan .

*Primary Examiner*—Viet Q. Nguyen
*Attorney, Agent, or Firm*—Foley & Lardner

[57] ABSTRACT

A semiconductor memory device comprises a plurality of sub bit lines 12a and 12b to which a plurality of memory cell transistors 13a through 13h are connected. The sub bit lines are selectively connected to a main bit line 11a. The sub and main bit lines are made of metallic material.

10 Claims, 7 Drawing Sheets

SEMICONDUCTOR MEMORY DEVICE

BACKGROUND OF THE INVENTION

The present invention relates to a semiconductor memory device and, more particularly, to a semiconductor memory device having main and sub bit lines.

One trend in recent semiconductor memory devices is toward larger storage capacity. Semiconductor devices having a large capacity have a plurality of memory cells connected to a single bit line. The memory cell in a flash memory, a read-only-memory (ROM), or an erasable and programmable read-only-memory (EPROM) typically comprises an MOS transistor. A drain of the MOS transistor is connected to the bit line. A parasitic capacitance exists between the drain and a semiconductor substrate on which the semiconductor memory device is formed. In addition, a small quantity of leak current flows from the drain to the semiconductor substrate. The parasitic capacitance and the leak current are not a problem for semiconductor memory devices having a small capacity. However, the sum total of the parasitic capacitance on and the leak current through the single bit line is not negligible for the semiconductor memory devices having a large capacity.

The bit line is typically connected to a sense amplifier. The sense amplifier discriminates information stored on the memory cell and produces a discrimination result as a signal of "0" or "1". The larger parasitic capacitance or leak current has disadvantages that the current for precharging the bit line increases and that a feeble signal read out of the memory cell cannot be discriminated by the sense amplifier.

Various semiconductor memory devices have been developed to solve the above-mentioned problems. More specifically, an example includes those having memory cells connected to a single bit line and divided into a several number of blocks. The memory cells of one block are connected to a sub bit line and a block selection transistor is placed between the sub bit line and a main bit line to connect them with each other. In other words, the semiconductor memory device of the type described comprises a plurality of sub bit lines each connected to the main bit line through the block selection transistors. The sub bit lines are connected to a plurality of memory cells. The main and sub bit lines are electrically connected to or disconnected from each other through the block selection transistors.

It looks as if the bit line is connected to the block selection transistors and to the memory cells in a selected block. This contributes to significant reduction of the parasitic capacitance and the leak current.

An example of this semiconductor memory device is disclosed in Japanese Patent Laid-open No. 8-204158. To be exact, the semiconductor memory device comprises a plurality of sub bit lines connected to memory cell transistors and a main bit line to which the sub bit lines are selectively connected. The semiconductor memory device also comprises an auxiliary wiring layer that is formed in the same conductive layer as a conductive layer for the main bit line and is electrically isolated from the main bit line. The auxiliary wiring layer is connected to the sub bit line. Thus the resistance of the sub bit line is restricted in the semiconductor memory device as represented by DINOR flash memories where the bit line is divided into the main and sub bit lines, which in turn results in higher level of integration as well as faster operation speed of the memory.

The sub bit line generally has its own resistance that restricts the length of the sub bit line and the number of memory cells per sub bit line that is connected to one block selection transistor. Twelve memory cell transistors are typically connected to one sub bit line. On the other hand, the above-mentioned restriction in the resistance of the sub bit line allows for thirty-two or more memory cell transistors to be connected to the single sub bit line. However, this configuration is not wholly beneficial in the above-mentioned semiconductor memory device where around a half of the sub bit line is formed with a polycide interconnection that has a high sheet resistance. The semiconductor memory device of this type has limitations in view of memory operation speed and level of integration. This is a drawback for the current semiconductor memory devices used in microcomputers that are very small computer systems where notable improvement in performance has been achieved because there has been a significant demand towards semiconductor memory devices much faster than those conventionally used. Nevertheless, a larger semiconductor memory device comprises longer bit lines. Such a configuration increases the parasitic capacitance and the resistance, badly affecting the speed to read information out of the memory. This means further restriction of the resistance of the bit line has been required, that is difficult to achieve by the conventional semiconductor memory devices.

SUMMARY OF THE INVENTION

Therefore, an object of the present invention is to provide a semiconductor memory device of which read out speed and level of integration are improved, making it being available for sophisticated and advanced computer systems.

A semiconductor memory device according to the present invention comprises a plurality of sub bit lines each of which is connected to a plurality of memory cell transistors. The sub bit lines are selectively connected to a main bit line.

According to an aspect of the present invention, the sub bit line and the main bit line are made of metallic material. The sub bit line and the main bit line may be formed in different metal wiring layers in a multi-layer wiring configuration that are made of the metallic material. Alternatively, the sub bit line and the main bit line may be formed in the same metal wiring layer in the multi-layer wiring configuration that is made of the metallic material.

DESCRIPTION OF THE PREFERRED EMBODIMENTS

Referring to FIGS. 1 through 4, a semiconductor memory device according to a first embodiment of the present invention is described. The first embodiment is described for the case where the semiconductor memory device is the one formed of non-volatile memory cells.

Figure 1:
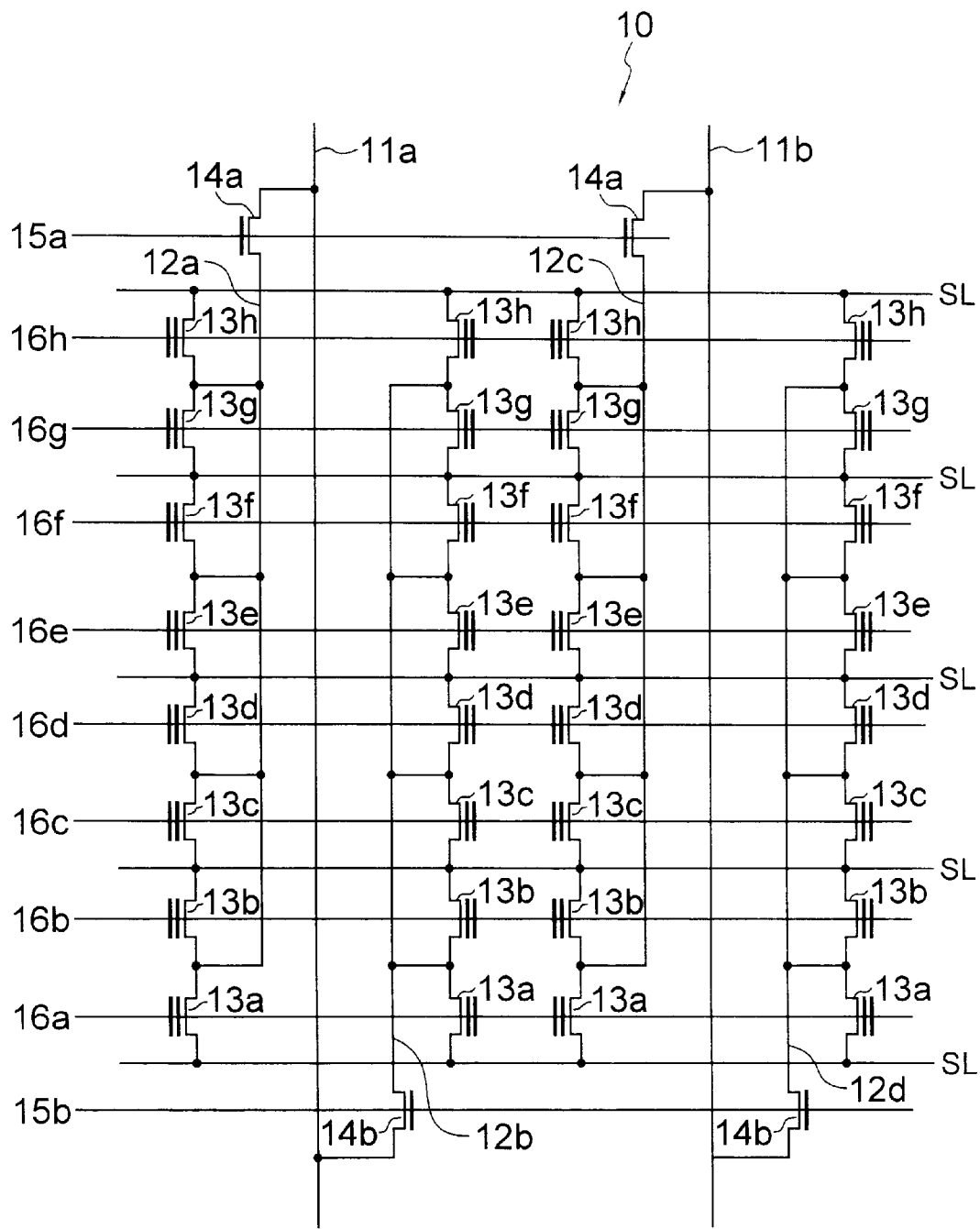
FIG. 1 is a view illustrating a configuration of a part of a semiconductor memory device according to a first embodiment of the present invention.

A semiconductor memory device 10 shown in FIG. 1 comprises a plurality of sub bit lines (SBL) selectively connected to a main bit line (MBL). A plurality of memory cell transistors (MC; hereinafter, referred to as memory cells) are connected to the sub bit lines. FIG. 1 illustrates two main bit lines 11a and 11b, two sub bit lines 12a and 12b that are selectively connected to the main bit line 11a, and two sub bit lines 12c and 12d that are selectively connected to the main bit line 11b. Eight memory cells 13a through 13h are connected to each of the sub bit lines 12a through 12d. A set of eight memory cells 13a through 13h forms a block.

The semiconductor memory device 10 also comprises a plurality of block selection lines 15a and 15b, a plurality of word lines (WL) 16a through 16h, and a plurality of source lines SL. The sub bit lines 12a and 12b are selectively connected to the main bit line 11a by means of block selection transistors 14a and 14b, respectively. Likewise, the sub bit lines 12c and 12d are selectively connected to the main bit line 11b by means of the block selection transistors 14a and 14b, respectively. In other words, the block selection transistors are for electrically connecting and disconnecting the main and sub bit lines to and from each other. The block selection line 15a is connected to gates of the two block selection transistors 14a. The block selection line 15b is connected to the gates of the two block selection transistors 14b. The word lines are each connected to the gates of the memory cells aligned as a row. The source lines SL are each connected to sources of the memory cells aligned as the row.

Now, further description is made in which similar components are described only for a representative one and not described repeatedly below. For the side of the main bit line 11a, the sub bit lines 12a and 12b are connected to the main bit line 11a at the opposite sides of the block. More particularly, the sub bit line 12a is connected to the main bit line 11a through the block selection transistor 14a on the side of the memory cell 13h. The sub bit line 12b is connected to the main bit line 11a through the block selection transistor 14b on the side of the memory cell 13a. The sub bit line 12a is aligned in parallel with the main bit line 11a on one side of the main bit line 11a such that it extends towards the memory cell 13a. The sub bit line 12b is aligned in parallel with the main bit line 11a on the other side of the main bit line 11a such that it extends towards the memory cell 13h. The above description is applied to the main bit line 11b. A pair of sub bit lines 12a and 12b are crossed with the word lines 16a through 16h at approximately right angles. The word lines 16a through 16h are each connected to the gates of two memory cells associated with the main bit line 11a. This is also true for the main bit line 11b.

The sub bit lines 12b and 12c are positioned between the adjacent main bit lines 11a and 11b. The sub bit lines 12b and 12c are connected to drains of the eight memory cells 13a through 13h. Two blocks, that is, two columns of memory cells 13a through 13h are aligned between the main bit lines 11a and 11b.

Figure 2:
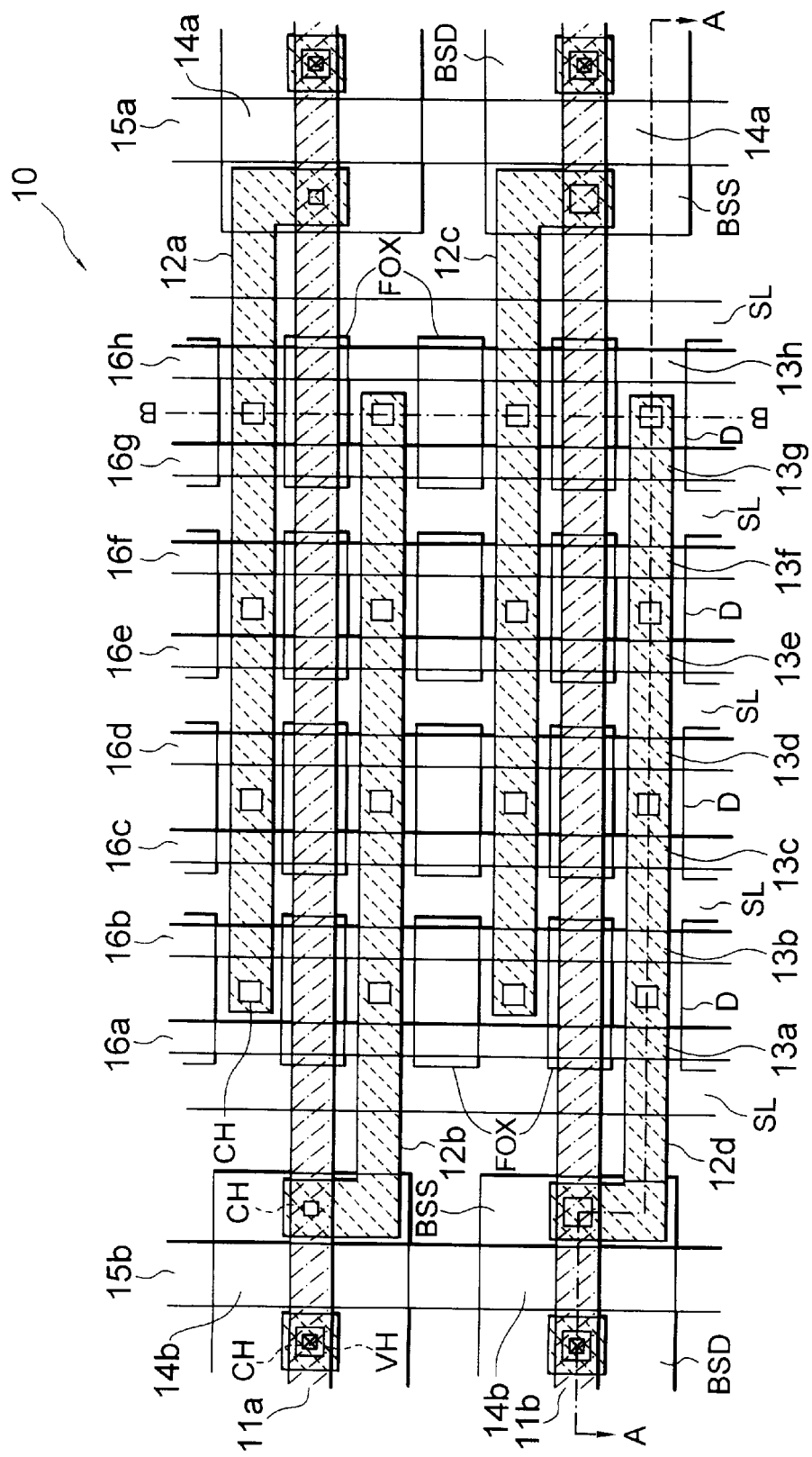
FIG. 2 is a view illustrating a layout of the semiconductor memory device in FIG. 1.
Figure 3:
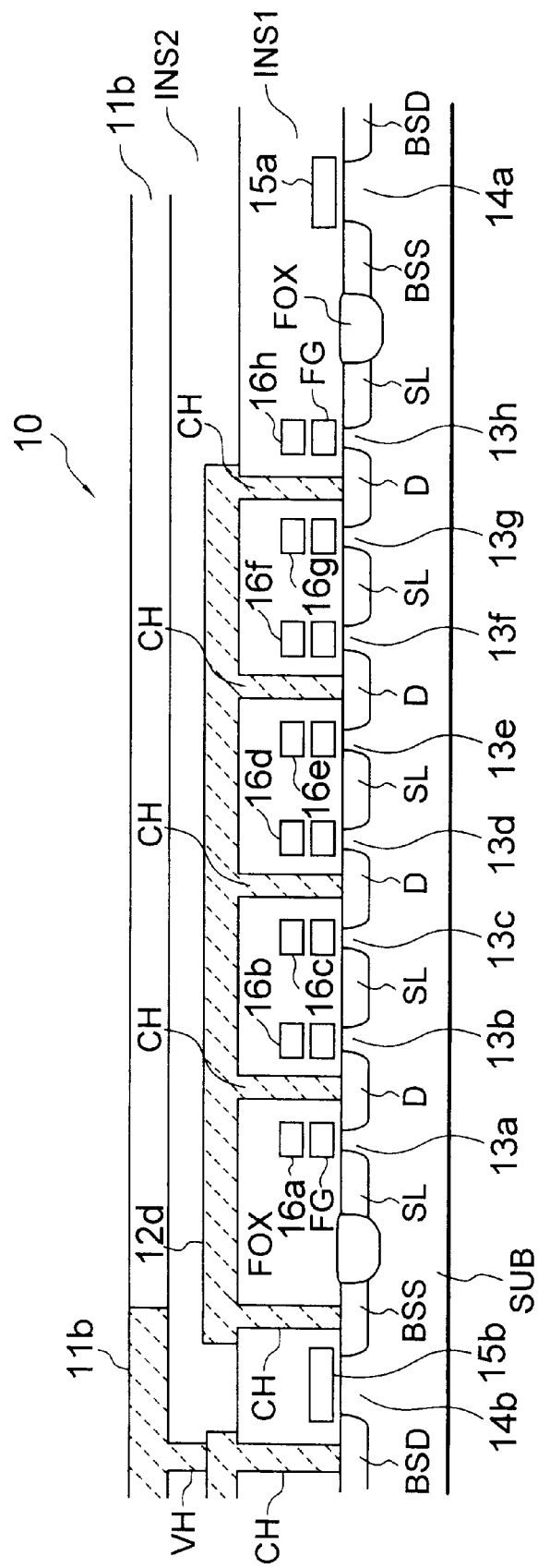
FIG. 3 is a cross-sectional view taken along a line A—A in FIG. 2.
Figure 4:
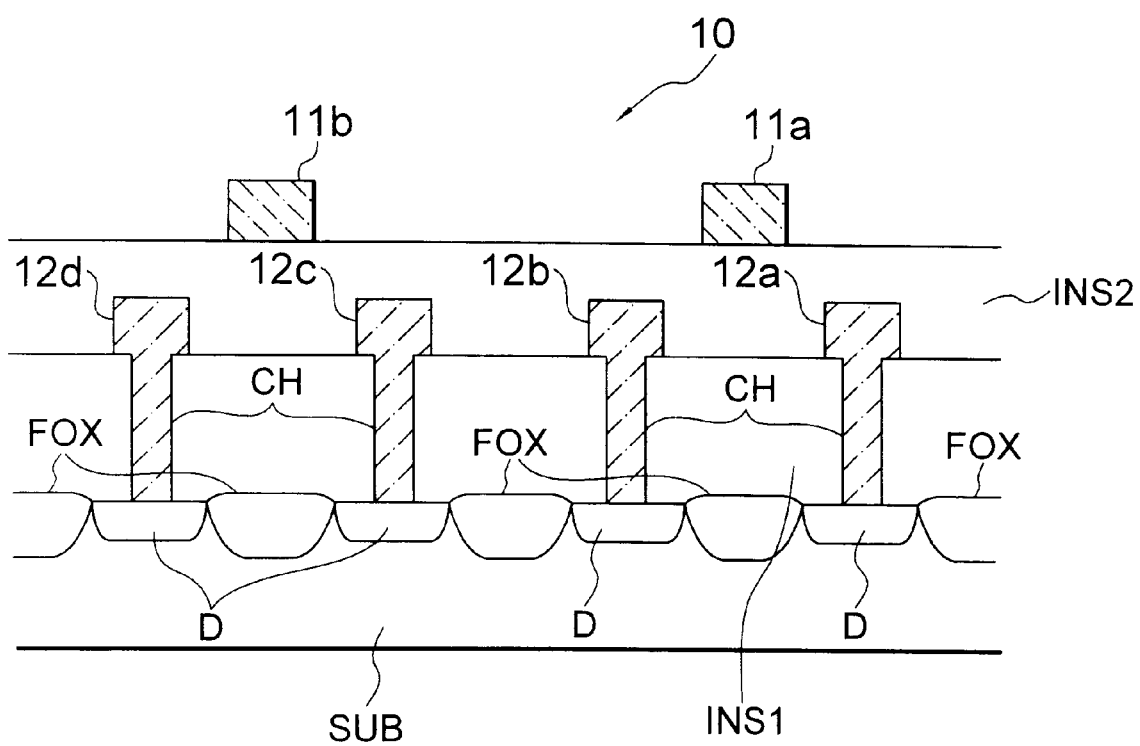
FIG. 4 is a cross-sectional view taken along a line B—B in FIG. 2.

As shown in FIGS. 2 through 4, the semiconductor memory device 10 comprises a multi-layer wiring structure having a plurality of metal wiring layers made of, for example, aluminum. The sub bit line 12d is formed on a first metal wiring layer provided on a semiconductor substrate SUB through a first interlayer insulating film INS1 (see FIG. 3). The main bit lines 11a and 11b are formed on a second metal wiring layer provided on the first metal wiring layer through a second interlayer insulating film INS2 (see FIG. 4).

The block selection lines 15a and 15b, the word lines 16a through 16h, and the source lines SL are arranged across the main bit lines 11a and 11b as well as the sub bit lines 12a, 12b, 12c, and 12d (see FIG. 1). The adjacent sub bit lines are arranged with the second interlayer insulating film INS2 being sandwiched therebetween (see FIGS. 2 and 4). The block selection transistors 14a and 14b are arranged at a certain distance from the main bit lines 11a and 11b (see FIG. 3).

The memory cells are formed on the semiconductor substrate SUB. The memory cell is formed of a floating gate FG, a control gate (not shown), a drain region D and a source region. The floating gate FG is insulated from its surroundings. The control gate is formed on the floating gate FG and is connected to the word line. The drain region D and the source region are provided on the semiconductor substrate SUB. The source region is depicted by SL for convenience because it is connected to the source line SL. The memory cells are covered with the first interlayer insulating film INS1. The drain region D of each memory cell is connected to the sub bit line through a contact hole CH in the first interlayer insulating film INS1.

The block selection transistor 14b formed on the semiconductor substrate SUB comprises a gate region, a drain region BSD, and a source region BSS. The gate region is insulated from the surroundings. The drain region BSD is formed on the semiconductor substrate SUB. The gate region is depicted by 15b for convenience because it is connected to the block selection line 15b. The block selection transistor 14b is covered with the first interlayer insulating film INS1. The source region BSS of the block selection transistor 14b is connected to the sub bit line 12d through the contact hole CH in the first interlayer insulating film INS1. The drain region BSD of the block selection transistor 14b is connected to the main bit line 11b through the contact hole CH and a via hole VH in the first and second interlayer insulating films INS1 and INS2 (see FIGS. 2 and 3). Though not completely illustrated in FIG. 3, this is also true for the block selection transistor 14a.

The source region BSS of the block selection transistor and the source region of the memory cell (source line SL) are arranged with a field oxidizing film FOX being sandwiched therebetween (see FIG. 3). The metal wiring layer forming the main and sub bit lines are made of material based on aluminum. Suitable materials include AlCu having the Cu content of 0.5%, AlSiCu having the Si content of 1% and the Cu content of 0.5%, and AlSi having the Si content of 1%.

As described above, in this embodiment, the sub bit lines are all formed of the metal wiring made of material based on aluminum that is significantly lower in sheet resistance than polysilicon. Therefore, the wiring resistance of the sub bit line is negligible even for a longer sub bit line. This makes it possible to increase the number of memory cells connected to a single sub bit line. It is noted that the conventional technique allows for only 12–32 memory cells for one sub bit line. On the contrary, the semiconductor memory device 10 according to this embodiment may comprise 100 or more memory cells for each sub bit line.

Consequently, the read out speed is improved. The number of block selection transistors may be reduced that are provided for the purpose of branching the sub bit lines from the main bit line. The reduction in number of the block selection transistors makes it possible to improve the level of integration. Therefore, the semiconductor memory device 10 according to this embodiment may be applied to, for example, a memory built in a sophisticated and advanced microcomputer.

The two sub bit lines are paired that are adjacent to each other with the main bit line sandwiched therebetween. A pair of the sub bit lines are oppositely directed and are arranged in parallel on both sides of the main bit line. This allows for a significant reduction of the main bit line, reducing the wiring resistance of the main bit line. Consequently, the access speed to and from the memory can be improved.

The step for forming a multi-layer metal wiring layer can be simultaneously made by means of forming the semiconductor memory device according to the present embodiment in the microcomputer comprised of the multi-layer metal wiring layer. Therefore, no additional step is required for the manufacture of the semiconductor memory devices.

Figure 5:
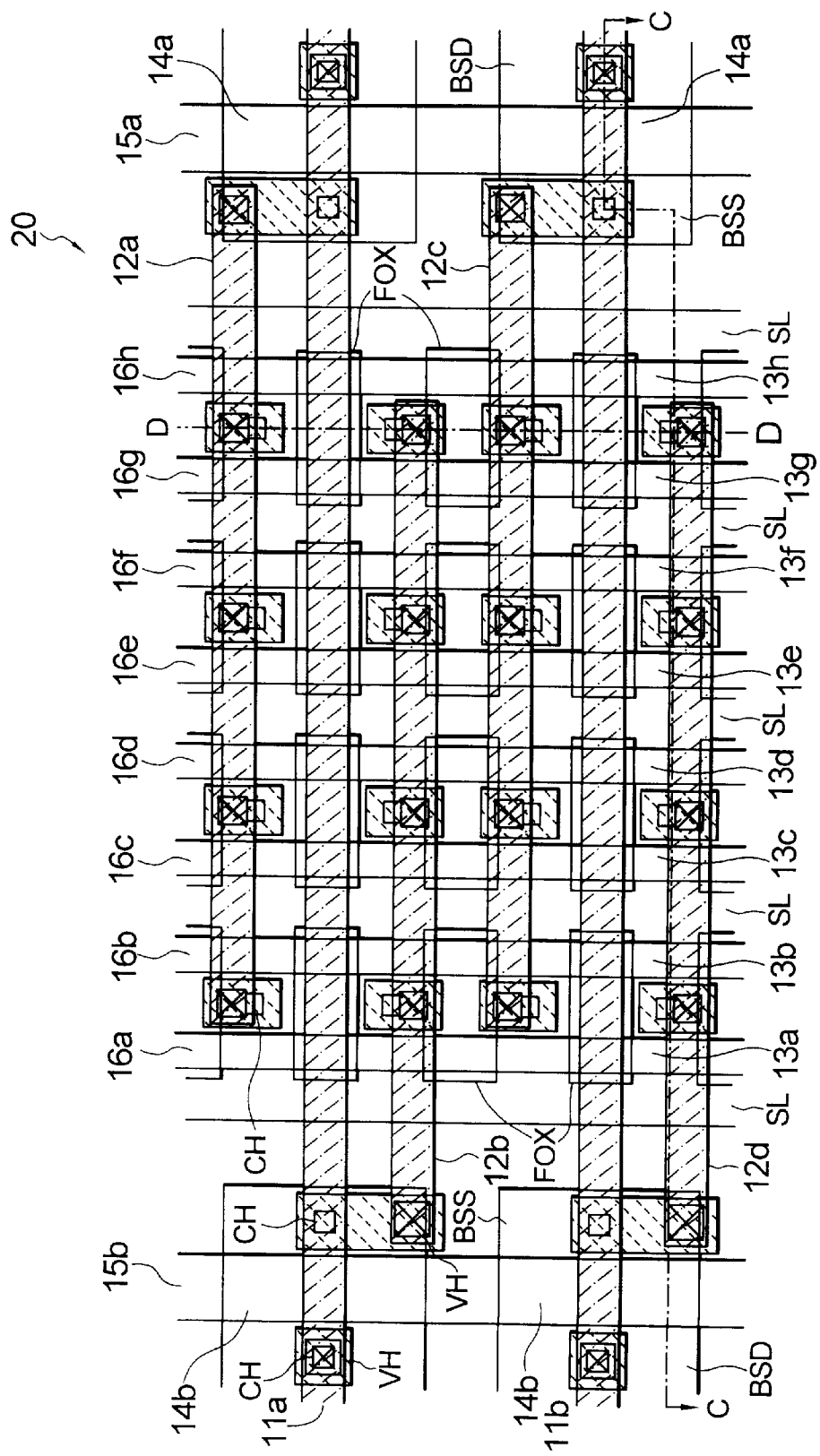
FIG. 5 is a view illustrating a layout of a semiconductor memory device according to a second embodiment of the present invention.
Figure 6:
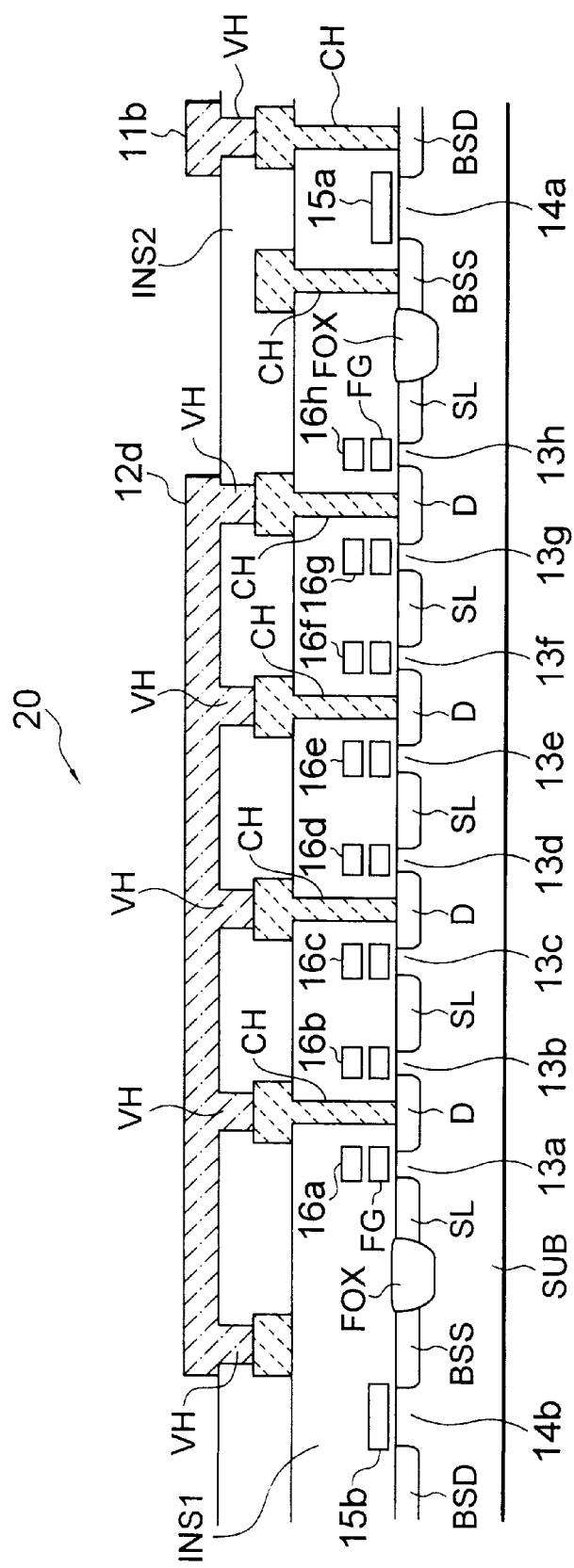
FIG. 6 is a cross-sectional view taken along a line C—C in FIG. 5.
Figure 7:
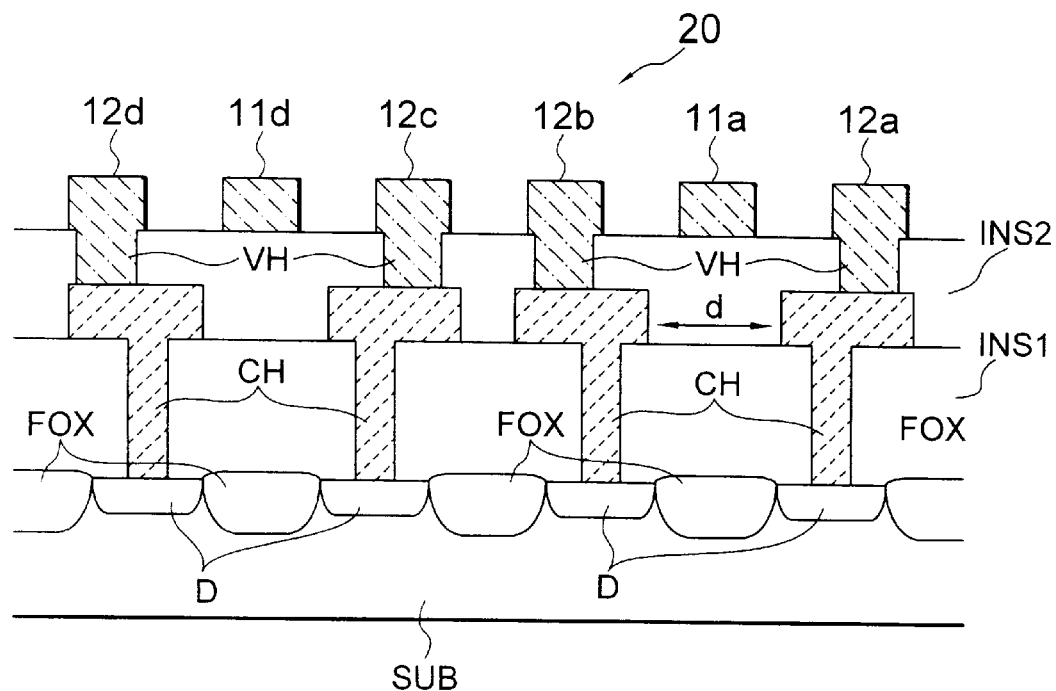
FIG. 7 is a cross-sectional view taken along a line D—D in FIG. 5.
Figure 8:
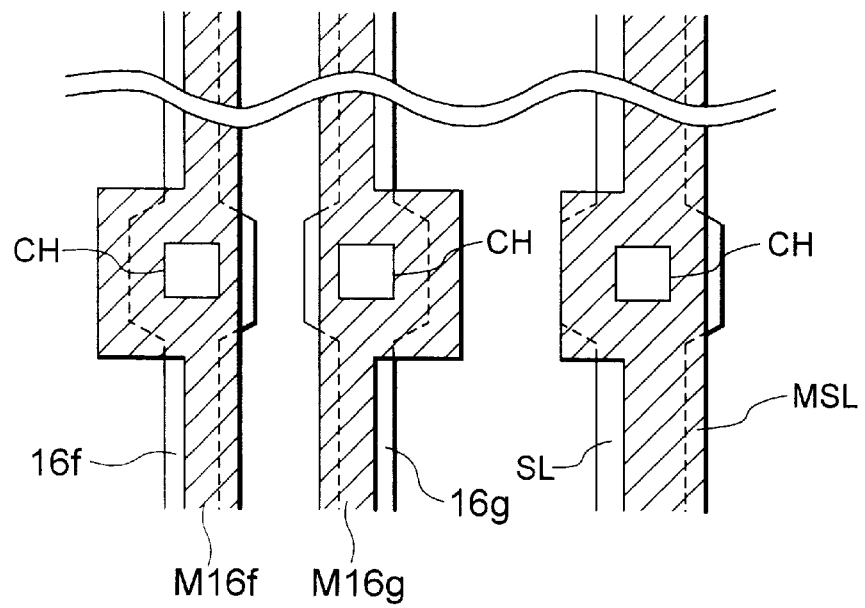
FIG. 8 is a view for use in describing a state where a metal word line and a metal source line are formed in a first metal wiring layer.

Referring to FIGS. 5 through 7, a semiconductor memory device 20 is similar in configuration to the semiconductor memory device 10 described in conjunction with FIG. 1, except that the sub bit lines 12*a* through 12*d* as well as the main bit lines 11*a* and 11*b* are formed of the second metal wiring layer made of material based on aluminum. In the semiconductor memory device 20, the drain region BSD of the block selection transistor 14*a* is interconnected to the first metal wiring layer through the contact hole CH and is also interconnected to the second metal wiring layer forming the main bit line 11*b* through the via hole VH. The source region BSS of the block selection transistor 14*a* is interconnected to the first metal wiring layer through the contact hole CH and is also interconnected to the second wiring layer forming the sub bit line 12*c* (FIG. 5) through the via hole that is away from the contact hole CH. The drain region D of the memory cell is interconnected to the first metal wiring layer through the contact hole CH and is also connected to the sub bit line 12*d* through the via hole VH (see FIGS. 5 and 6). It is also true for the block selection transistor 14*b*.

The semiconductor memory device 20 having the above-mentioned configuration comprises the sub bit lines formed in the second metal wiring layer. For this purpose, the first metal wiring layer is connected to the drain region BSD of the block selection transistor in the contact hole CH and the first metal wiring layer is interconnected to the second metal wiring layer through the via hole VH. Thus, the main and sub bit lines are formed in the second metal wiring layer and the sub bit lines 12*a* through 12*d* extend in parallel with the main bit lines 11*a* and 11*b* (see FIGS. 5 and 7).

For the interconnection between the second metal wiring layer and the memory cell, the second metal wiring layer is interconnected to the first metal wiring layer in the via hole VH and then the first metal wiring layer and a diffusing layer of the memory cell. As a result, two sub bit lines are paired for every main bit line. These two sub bit lines are connected to the same word line 16*a* through 16*h* and are connected to different block selection lines with the different block selection transistors (see FIG. 5). The contact hole is so formed that it is positioned at the center of the drain region of the memory cell in FIG. 7. Furthermore, the first metal wiring layer is formed to have a larger diameter than the contact hole CH, taking positional shifting between the first metal wiring layer and the contact hole into account. Therefore, a distance d (FIG. 7) between the first metal wiring layers is narrow in the contact hole CH for the sub bit lines 12*a* and 12*b* that are connected to the main bit line 11*a*. If there is a room for allowing the main bit line 11*a* to pass through the space indicated by the distance d, the main bit line 11*a* and the sub bit lines 12*a* and 12*b* may be formed only with the first metal wiring layer. If not, then the configuration is similar to the one made in this embodiment. More specifically, the distance between the via holes for the sub bit lines 12*a* and 12*b* connected to the main bit line 11*a* is larger than the width of the contact hole CH in FIG. 7. The sub bit lines 12*a* and 12*b* are formed with the second metal wiring layer. This gives a margin for the distance between the main bit line 11*a* and the sub bit lines 12*a* and 12*b*. This is also true for the section on the side of the main bit line 11*b*. Consequently, there is an allowance for the accuracy of alignment during the manufacturing process, facilitating the production of the semiconductor memory devices. In addition, the capacitance between the interconnections and the leak can be reduced, improving reliability of the resultant semiconductor memory devices. On the contrary, reduction of the margin makes it possible to comply with requirements for further miniaturization with the reduction of a chip area.

As apparent from the above, the semiconductor memory device 20 can provide similar effects to those obtained with the semiconductor memory device 10. In addition, the first metal wiring layer can be formed in the direction crossing with the main and sub bit lines by means of forming both the main and sub bit lines with the second metal wiring layer. In this event, metal word lines (such as M16*f* and M16*g*) and a metal source line (MSL) are formed in the first metal wiring layer. Furthermore, they are connected to word lines (such as 16*f* and 16*g*) and the source line (SL) through the contact holes by every few bits. This reduces the wiring resistance of the word lines (WL) and the source line (SL) and also reduces any delay of a signal on the word line(s).

The first and second metal wiring layers forming the main and sub bit lines in the first and the second embodiments is not limited to the one described above and may be any material based on, for example, aluminum that has a significantly low wiring resistance. The number of the metal wiring layers where the main and sub bit lines are formed is not limited to two and three or more metal wiring layers may present. The present invention is applicable to ROMs and EPROMs in addition to non-volatile memories. It can also be applied to semiconductor memory device configurations of a NAND type with the memory cells being connected in series.

What is claimed is:

1. A semiconductor memory device comprising:

a metallic main bit line;

a plurality of memory cell transistors aligned in first and second rows in parallel with the main bit line along opposing sides of the main bit line; and first and second metallic sub bit lines aligned in parallel with the main bit line along opposing sides of the main bit line, each sub bit line connected respectively to the memory cell transistors of the first and second rows, the first sub bit line being selectively connected through a block selection transistor to the main bit line near a first end of said rows, and the second sub bit line being selectively connected through a block selection transistor to the main bit line near a second end of said rows, the main bit line and first and second sub bit lines being formed in metal wiring layers of the semiconductor memory device.

2. A semiconductor memory device as claimed in claim 1, wherein the sub bit lines and the main bit line are formed in different metal wiring layers in a multi-layer wiring configuration made of metallic material.

3. A semiconductor memory device as claimed in claim 2, wherein the metallic material comprises aluminum.

4. A semiconductor memory device as claimed in claim 3, wherein the metallic material is selected from the group consisting of AlCu having the Cu content of 0.5%, AlSiCu having the Si content of 1% and the Cu content of 0.5%, and AlSi having the Si content of 1%.

5. A semiconductor memory device as claimed in claim 1, wherein the sub bit lines and the main bit line are formed in the same metal wiring layer in a multi-layer wiring configuration that is made of metallic material.

6. A semiconductor memory device as claimed in claim 5, further comprising a first metal wiring layer and a second metal wiring layer, the first metal wiring layer being formed in the direction crossing with the main bit line and the sub bit lines, the main bit line and the sub bit lines being formed in the second metal wiring layer.

7. A semiconductor memory device as claimed in claim 6, wherein a plurality of word lines are connected to gates of the plurality of the memory cell transistors, respectively, and a plurality of source lines are connected to sources of the plurality of the memory cell transistors, respectively, one of the plurality of word lines and the plurality of source lines being formed in the first metal wiring layer.

8. A semiconductor memory device as claimed in claim 5, wherein the metallic material is comprised of aluminum.

9. A semiconductor memory device as claimed in claim 8, wherein the metallic material is selected from the group consisting of AlCu having the Cu content of 0.5%, AlSiCu having the Si content of 1% and the Cu content of 0.5%, and AlSi having the S1 content of 1%.

10. A semiconductor memory device as claimed in claim 1, wherein the main bit line and sub bit lines have a common line width.

\* \* \* \* \*